US011431308B2

(12) United States Patent
Abawi

(10) Patent No.: US 11,431,308 B2
(45) Date of Patent: Aug. 30, 2022

(54) DIFFERENTIAL NOISE CANCELLATION

(71) Applicant: Baker Hughes Oilfield Operations LLC, Houston, TX (US)

(72) Inventor: Daniel Abawi, Gardnerville, NV (US)

(73) Assignee: BAKER HUGHES OILFIELD OPERATIONS LLC, Houston, TX (US)

( * ) Notice: Subject to any disclaimer, the term of this patent is extended or adjusted under 35 U.S.C. 154(b) by 817 days.

(21) Appl. No.: 16/376,284

(22) Filed: Apr. 5, 2019

(65) Prior Publication Data
US 2020/0321930 A1 Oct. 8, 2020

(51) Int. Cl.
| H03F 3/45 | (2006.01) |
| H03F 1/56 | (2006.01) |
| G01R 13/02 | (2006.01) |
| G01R 15/12 | (2006.01) |
| E21B 41/00 | (2006.01) |

(52) U.S. Cl.
CPC ......... *H03F 3/45071* (2013.01); *E21B 41/00* (2013.01); *G01R 13/0218* (2013.01); *G01R 15/125* (2013.01); *H03F 1/56* (2013.01); *H03F 2200/129* (2013.01); *H03F 2200/222* (2013.01); *H03F 2200/228* (2013.01); *H03F 2200/387* (2013.01); *H03F 2203/45116* (2013.01); *H03F 2203/45528* (2013.01)

(58) Field of Classification Search
CPC .. G01R 13/0218; G01R 15/125; G01R 19/10; G01R 13/0128; H03F 3/45071; H03F 3/4475; H03F 1/26; H03F 1/56; H03F 2200/228; H03F 2200/129; H03F 2203/45116; H03F 2203/45528; H03F 2200/222; E21B 41/00
See application file for complete search history.

(56) References Cited

U.S. PATENT DOCUMENTS

| 11,031,948 B1 * | 6/2021 | Wang ...................... H03M 1/70 |
| 2016/0111009 A1 * | 4/2016 | Lu .......................... G10K 11/16 |
| | | 381/94.2 |
| 2020/0066309 A1 * | 2/2020 | Mayer .................. G11C 29/021 |

\* cited by examiner

*Primary Examiner* — Thanh C Le
(74) *Attorney, Agent, or Firm* — Mintz Levin Cohn Ferris Glovsky and Popeo, PC; Lisa Adams

(57) ABSTRACT

In one implementation, a circuit can include a reference pin and an operational amplifier that can include an output pin, an inverting input pin and a non-inverting input pin. The inverting input pin can be electrically coupled to the output pin via a first impedance and to the reference pin via a second impedance. The non-inverting input pin can be electrically coupled to the reference pin via a third impedance and can be configured to receive a detection signal. The reference pin can be configured to receive a detection reference signal associated with the detection signal.

24 Claims, 4 Drawing Sheets

DIFFERENTIAL NOISE CANCELLATION

BACKGROUND

A buffer amplifier ("buffer") can transform electrical impedance between a signal circuit and a load circuit. For example, the buffer can shield the signal circuit from currents (or voltages) generated in the load circuit. A buffer can be a voltage buffer or a current buffer. A voltage buffer amplifier can transfer a voltage from the signal circuit having a high output impedance level to the load circuit with a low input impedance level. A current buffer can transfer a current from the signal circuit having a low output impedance level to a load circuit with a high input impedance level. The buffer amplifier can prevent the signal source from being affected by voltages/currents that the load may produce.

SUMMARY

In one implementation, a circuit can include a reference pin and an operational amplifier that can include an output pin, an inverting input pin and a non-inverting input pin. The inverting input pin can be electrically coupled to the output pin via a first impedance and to the reference pin via a second impedance. The non-inverting input pin can be electrically coupled to the reference pin via a third impedance and can be configured to receive a detection signal. The reference pin can be configured to receive a detection reference signal associated with the detection signal.

One or more of the following features can be included in any feasible combination.

In one implementation, the output pin can be configured to electrically couple to a first lead of an external circuit and the reference pin can be configured to electrically couple to a second lead of the external circuit. The operational amplifier can be configured to isolate an output signal at the output pin from a reference signal at the reference pin. In another implementation, the operational amplifier can be configured to isolate the output signal from the reference signal based on a feedback circuit including the first impedance, the second impedance and the third impedance. The operational amplifier and the feedback circuit can be configured to vary the output signal to follow the fluctuations in the reference signal. The first impedance, the second impedance and the third impedance can have the same impedance value.

In one implementation, a first difference between the output signal at the output pin and the reference signal at the reference pin can be indicative of a second difference between the detection signal and the detection reference signal. In another implementation the reference pin can be configured to electrically couple to a third lead of an input circuit. The third lead can be configured to transmit the detection reference signal or a signal indicative of the detection reference signal. In yet another implementation, isolation of the output signal can include suppression of a noise signal indicative of voltage fluctuations in the external circuit. The reference signal can include the noise signal.

In one implementation, an instrumentation device includes the external circuit, and the instrumentation device is configured to analyze the detection signal. The detection signal and the detection reference signal can be indicative of a sensor measurement at an oil and gas industrial machine. In another implementation, the circuit can further include a filtering circuit wherein the reference pin or the non-inverting input pin can be configured to receive the detection reference signal via the filtering circuit. The filtering circuit can include one of a high-pass filter, a low-pass filter, and a band-pass filter. In yet another implementation, the operational amplifier can include one or more bipolar junction transistor and/or one or more metal-oxide semiconductor field-effect transistors.

In one implementation, a circuit can include a reference pin and an operational amplifier that can include an output pin, an inverting input pin and a non-inverting input pin. The inverting input pin can be electrically coupled to the output pin via a first impedance and to the reference pin via a second impedance. The inverting input pin can be configured to receive a detection signal. The non-inverting input pin can be electrically coupled to the reference pin via a third impedance. The non-inverting pin can be configured to receive a detection reference signal associated with the detection signal.

One or more of the following features can be included in any feasible combination.

In one implementation, the output pin can be configured to electrically couple to a first lead of an external circuit and the reference pin can be configured to electrically couple to a second lead of the external circuit. The operational amplifier can be configured to isolate an output signal at the output pin from a reference signal at the reference pin. In another implementation, the operational amplifier can be configured to isolate the output signal from the reference signal based on a feedback circuit including the first impedance, the second impedance and the third impedance. The operational amplifier and the feedback circuit can be configured to vary the output signal to follow the fluctuations in the reference signal. The first impedance, the second impedance and the third impedance can have the same impedance value.

In one implementation, a first difference between the output signal at the output pin and the reference signal at the reference pin can be indicative of a second difference between the detection signal and the detection reference signal. In another implementation, isolation of the output signal can include suppression of a noise signal indicative of voltage fluctuations in the external circuit. The reference signal can include the noise signal. In yet another implementation, an instrumentation device includes the external circuit, and the instrumentation device is configured to analyze the detection signal.

In one implementation, the detection signal and the detection reference signal can be indicative of a sensor measurement at an oil and gas industrial machine. In another implementation, the operational amplifier can include one or more bipolar junction transistor and/or one or more metal-oxide semiconductor field-effect transistors. In yet another implementation, the first impedance, the second impedance and the third impedance can have a predetermined impedance value.

In one implementation, a detection system can include a sensor configured to detect one or more properties of an oil and gas industrial machine and generate a detection signal and a detection reference signal indicative of the detection. The detection system can also include a buffer circuit. The buffer circuit can include a reference pin and an operational amplifier that can include an output pin, an inverting input pin and a non-inverting input pin. The reference pin can be configured to receive the detection reference signal. The inverting input pin can be electrically coupled to the output pin via a first impedance and to the reference pin via a second impedance. The non-inverting input pin can be electrically coupled to the reference pin via a third impedance and can be configured to receive a detection signal. The detection system can include an instrumentation device including a first lead and a second lead. The first lead can be electrically coupled to the output pin and the second lead can be electrically coupled to the reference pin.

One or more of the following features can be included in any feasible combination.

In one implementation, the operational amplifier can be configured to isolate an output signal at the output pin from a reference signal at the reference pin. In another implementation, the instrumentation device can be configured to analyze the detection signal.

These and other capabilities of the disclosed subject matter will be more fully understood after a review of the following figures, detailed description, and claims.

BRIEF DESCRIPTION OF THE FIGURES

These and other features will be more readily understood from the following detailed description taken in conjunction with the accompanying drawings, in which.

DETAILED DESCRIPTION

Buffers (or buffer circuits) can act as a liaison between a source circuit (e.g., an input circuit) and a receiving circuit (e.g., an output circuit). In some implementations, buffer circuits can communicate a signal (e.g., a voltage signal, a current signal, etc.) from the source circuit to the receiving circuit while transforming the impedance of the source circuit. Transformation of source circuit impedance can be desirable when there is an impedance mismatch between the source and the receiving circuits which can damage the source circuit. For example, a buffer circuit that electrically couples a sensor (e.g., at an oil and gas industrial machine) to an instrumentation device can electrically shield the sensor from current/voltage in the instrumentation device. Existing buffer circuits directly connect the reference lead of the source circuit (e.g., indicative of source circuit ground potential) with the reference lead of the receiving circuit (e.g., indicative of receiving circuit ground potential). If the ground potentials of the source and receiving circuits are mismatched, current can flow between the reference leads of the source and receiving circuits ("ground loop") that can generate undesirable results (e.g., fluctuations in an output signal of the buffer circuit). Accordingly improved buffer circuits and corresponding methods are provided that can prevent and/or reduce fluctuations in the output of the buffer circuit.

Figure 1A:
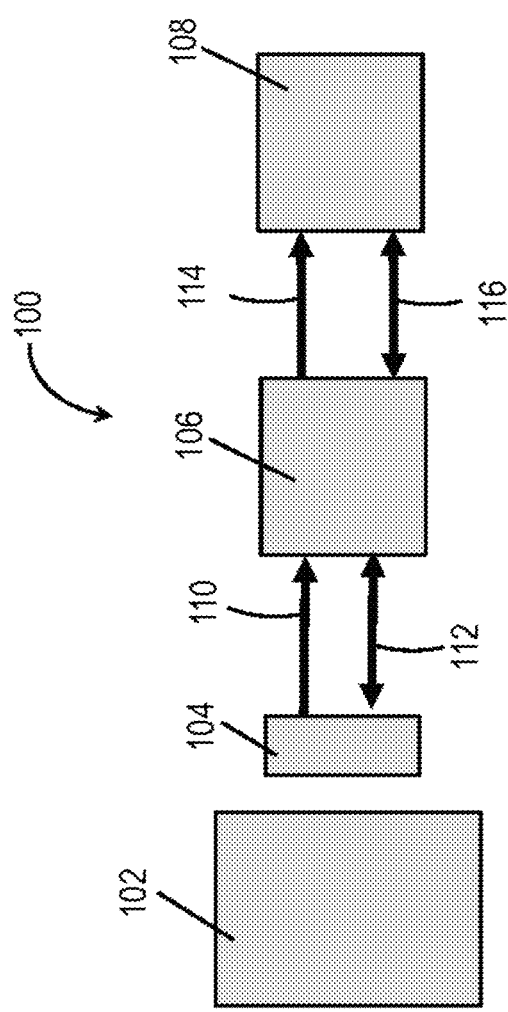
FIG. 1A illustrates an exemplary schematic of a detection system configured to detect one or more operational characteristic of an industrial machine.

FIG. 1 illustrates an exemplary schematic of a detection system 100 configured to detect one or more operational characteristic of an industrial machine 102. The detection system 100 can include an input circuit 104 (e.g., a sensor configured to detect an operational characteristic of the industrial machine 102), a buffer circuit 106, and an output circuit 108 (e.g., a circuit in an instrumentation device configured to analyze detected properties of the industrial machine 102).

The input circuit 104 and the buffer circuit 106 can be electrically connected via a first electrical connection 110 and a second electrical connection 112. In some implementations, the first electrical connection 110 can transmit an input circuit signal (e.g., a voltage signal or a current signal indicative of a sensor measurement) and the second electrical connection 112 can transmit a first reference signal associated with the input circuit. In some implementations, a difference between the input circuit signal and the first reference signal can be indicative of a detected characteristic property of the industrial machine 102.

The output circuit 104 and the buffer circuit 106 can be electrically connected via a third electrical connection 114 and a fourth electrical connection 116. In some implementations, the third electrical connection 114 can transmit an output signal (e.g., a voltage signal or a current signal indicative of a sensor measurement of industrial machine 102 can be transmitted by the buffer circuit) and the fourth electrical connection 116 can transmit a second reference signal associated with the output circuit. For example, the second reference signal can be transmitted by the output circuit 108 (e.g., second reference signal can be a reference ground potential of the output circuit 108) and received by the buffer circuit 106. In some implementations, a difference between the output signal from the buffer circuit 106 and the second reference signal from the output circuit 108 can be indicative of a detected property of the industrial machine 102.

The buffer circuit 106 can transform an impedance of the input circuit with respect to the output circuit. The buffer circuit 106 can receive an input signal from the input circuit 104 (e.g., difference between the signals on first electrical connection 110 and second electrical connection 112) and transmit an output signal (e.g., difference between the signals on the third electrical connection 114 and fourth electrical connection 116) to the output circuit 108. The buffer circuit 106 can include one or more of operational amplifiers (op-amp), bipolar junction transistors (BJT), metal-oxide semiconductor field-effect transistor (MOSFET), resistors, capacitors, inductors and the like.

Operational amplifiers can include three external pins: an output pin, an inverting input pin (indicated by a "−" sign) and a non-inverting input pin (indicated by a "+" sign). The op-amp can receive a first and a second signal via the inverting and the non-inverting input, respectively. In some implementations, the op-amp can amplify a difference between voltages associated with the first and second signals. In some implementations, the op-amp can include a feedback circuit. For example, an output of the op-amp can be electrically connected to the inverting and/or the non-inverting inputs via one or more impedances (e.g., resistors, capacitors, inductors, etc.). Based on the feedback circuit, the op-amp can perform a variety of operations (e.g., voltage follower, voltage inverter, voltage integrator, voltage differentiator, differential amplifers and the like.

Figure 1B:
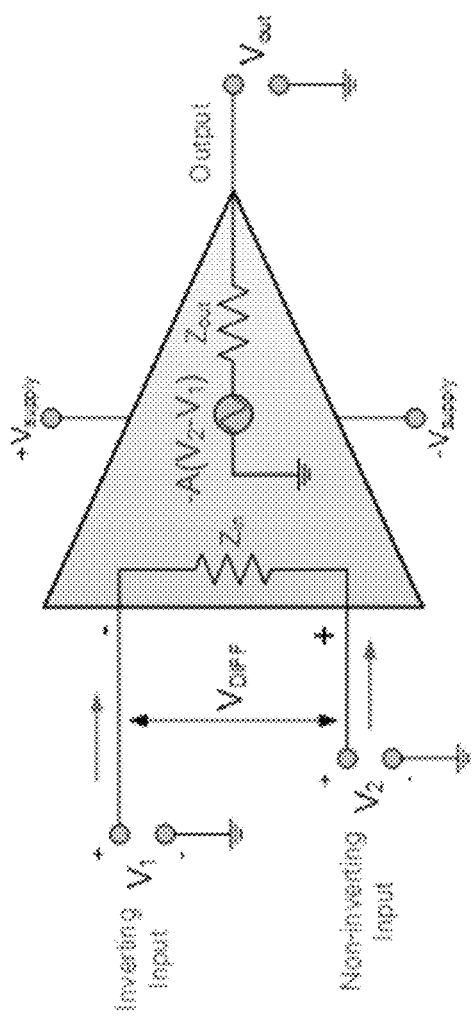
FIG. 1B illustrates an equivalent circuit of an exemplary operational amplifier.

FIG. 1B illustrates an equivalent circuit of an exemplary operational amplifier. The op-amp can include an inverting input that can receive an inverting input (V1), and a non-inverting input that can receive a non-inverting input (V2). The op-amp can also include an output pin Vout that transmits an output signal. In some implementations, the output signal can be proportional to the difference between the inverting and non-inverting inputs (e.g., when the output is electrically connecting to the non-inverting input via an impedance [e.g., a resistor, a capacitor, an inductor, or a combination thereof]). In some implementations, the output signal can be inversely proportional to the input signal (e.g., when the output is electrically connecting to the inverting input via an impedance [e.g., a resistor]). In some implementations, an impedance looking into the op-amp across the inverting and non-inverting inputs can be very high. In some implementations, current flowing into the op-amp via the inverting and non-inverting inputs can be very small (e.g., zero). In some implementations, the op-amp with a feedback will try to adjust the output voltage such that voltages at the inverting and the non-inverting inputs are the same. Based on the aforementioned properties of the op-amp and the desirable operation of the op-amp, values and arrangement of impedances in the feedback circuit can be determined. In some implementations, the buffer circuit 106 can include a voltage follower circuit (e.g., output signal is the same as in the input signal), a non-inverter circuit (e.g., output signal is directly proportional to the input signal), an inverter circuit (e.g., output signal is inversely proportional to the input signal) and the like.

Existing buffer circuits couple the second electrical connection 112 (e.g., transmitting first reference signal associated with the input circuit 104) with the fourth electrical connection 116 (e.g., transmitting second reference signal associated with the output circuit 106). In some implementations, if there is a mismatch between the first reference signal and the second reference signal (e.g., voltages associated with the first and second reference signal are different), current can flow between the buffer circuit 106 and the output circuit 108 (also referred to as "ground loop"). This can result in undesirable (e.g., spurious) fluctuations in an output signal of the buffer circuit 106. Implementations of improved buffer circuits described in this application can include feedback circuits that can suppress output signal fluctuations resulting from the ground loop. In some implementations, a reference pin in the buffer circuit (e.g., electrically coupled to the second electrical connection 112 and the fourth electrical connection 116) can be electrically coupled to a non-inverting input (or an inverting input) of an op-amp in the buffer circuit 106 via an impedance (e.g., resistor, capacitor, inductor or a variation thereof). The buffer circuit can be designed (e.g., based on impedance value) to suppress output signal fluctuation.

Figure 2:
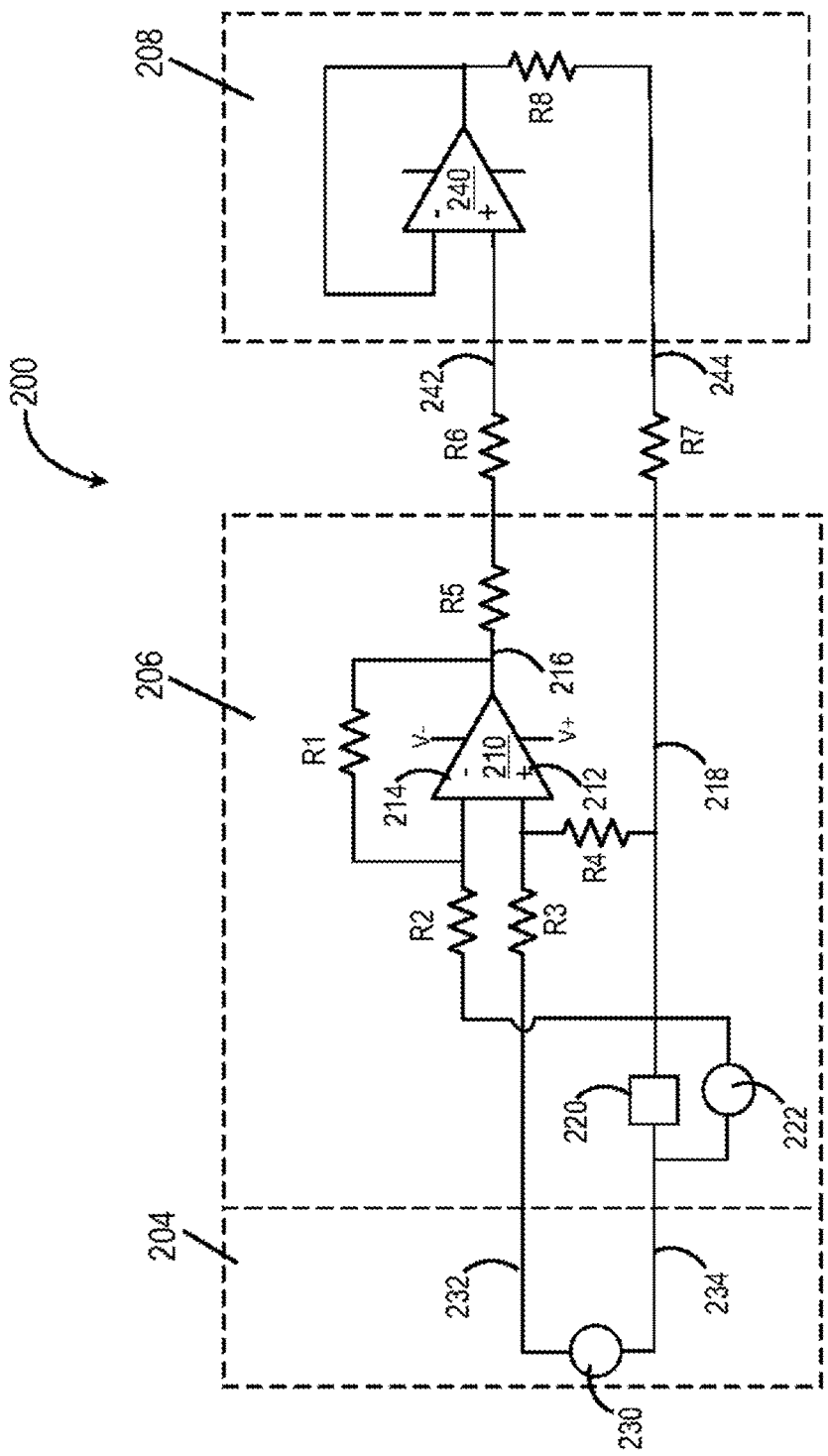
FIG. 2 illustrates an exemplary non-inverting detection system.

FIG. 2 illustrates an exemplary detection system 200 (e.g., a non-inverting detection system). The detection system 200 can include an input circuit 204, a buffer circuit 206, and an output circuit 208. The input circuit 204 can include, for example, a sensor. The sensor can include a voltage (or current) source 230 that can generate a voltage (or current) signal indicative of a measurement of a characteristic property of an industrial machine (e.g., oil and gas industrial machine). The input circuit 204 can include a first lead 232 (that can transmit a detection signal) and a second lead 234 (that can transmit a detection reference signal). The buffer circuit 206 can be electrically connected to the input circuit 204. For example, the buffer circuit 206 can be connected to the first lead 232 and the second lead 234 by electrical connections (e.g., by first and second electrical connections 112 and 114, respectively). The buffer circuit 206 can include an op-amp 210 which can include a non-inverting input pin 212, an inverting input pin 214 and an output pin 216. The detection signal or a signal indicative of the detection signal can be received by the non-inverting input 212 via the impedance R3.

The buffer circuit 206 can include a reference pin 218 which can be electrically connected to the second lead 234. The reference pin 218 can receive a signal indicative of the detection reference signal from the second lead 234. In some implementations, the buffer circuit 206 can include a filtering circuit 220 that can receive and modify the detection reference signal, and transmit the modified signal to the reference pin 218. In some implementations, the filtering circuit 220 can include a high-pass filter, a low-pass filter, a band pass filter and the like. The filtering circuit 220 can modify the detection reference signal by filtering/suppressing high frequency components, low frequency components, and the like. In some implementations, the filtering circuit 220 can be electrically coupled between the first lead 232 and the impedance R3. In this configuration, it can modify the detection signal transmitted by the first lead 232.

The inverting input pin 214 can be electrically connected to the output pin 216 via a first impedance R1, and to the reference pin 218 via a second impedance R2. The non-inverting input 212 can be electrically connected to the first lead 232 via a third impedance R3, and to the reference pin 218 via a fourth impedance R4. The buffer circuit 206 can be electrically connected to an output circuit 208 (also referred to as "external circuit"). In some implementations, the output circuit 208 can be a part of an instrumentation system configured to analyze one or more characteristic properties of an industrial machine (e.g., industrial machine 102) detected by a sensor (e.g., a sensor included in the input circuit 204). For example, the instrumentation system can be a diagnostic equipment (e.g., oscilloscopes, digital control system, digital multimeter, and the like.). In some implementations, the output circuit 208 can be a part of a display device configured to display characteristic property data detected by the input circuit 204. The output circuit 208 can include one or more of op-amps, resistors, inductors, capacitors and other circuit elements. The output circuit 208 can include a third lead 242 and a fourth lead 244. The output circuit 208 can be electrically connected to the buffer circuit 206. For example, third lead 242 and fourth lead 244 can be electrically connected to output pin 216 and reference pin 218, respectively, via a field wiring. The field wiring can include impedances R6 and R7 (e.g., that electrically couple the output pin 216 to the third lead 242, and reference pin 218 to the fourth lead 244, respectively).

The buffer circuit 206 can transform an impedance associated with the input circuit 204. The buffer circuit 206 can receive a signal from the input circuit 204 (e.g., signal indicative of a detection by a sensor in the input circuit 204 related to a difference between the detection signal and detection reference signal), and the output circuit can receive a signal from the buffer circuit 206 (e.g., which can be related to the signal received by the buffer circuit). For example, a difference between the output signal (e.g., at output pin 216) and reference signal (e.g., at reference pin 218) can be proportional to the signal received by the buffer circuit 206 from the input circuit 204. In some implementations, the output signal of the buffer circuit 206 can be an integral over time of the input signal (e.g., when the impedance R1 is a capacitor and the impedance R2 is a resistor). In some implementations, the output signal of the buffer circuit 206 can be a differential over time of the input signal (e.g., when the impedance R2 is a capacitor and the impedance R1 is a resistor).

As described above, the reference pin 218 can be electrically coupled to the second lead 234 of the input circuit 204 and to the fourth lead 244 of output circuit 208. In some implementations, the second lead 234 and the fourth lead 244 are ground (e.g., are at a ground potential). This can cause the reference lead 218 to be at the ground potential, and current may not flow between the second lead 234 (or fourth lead 244) and the reference lead 218. In some implementations, the second lead 234 (or reference lead 218) and the fourth lead 244 may not be at the same potential. This can result in flow of current between the second lead 234 and the reference lead 218, and/or between the fourth lead 244 and the reference lead 218. The aforementioned current flow can occur due to undesirable potential fluctuations in the output circuit 208 (or in the instrumentation device that includes the output circuit 208) which can lead to a fluctuation in the reference signal at the reference pin 218. Additionally or alternately, undesirable potential fluctuation in the reference signal can occur due to thermal noise, noise in the surrounding environment, crosstalk, and the like. For example, the output circuit 208 can introduce noise into the buffer circuit 206 (e.g., via the fourth lead 244 to the reference pin 218). Fluctuations in the reference signal can lead to fluctuations in the output signal (e.g., output signal at the output pin 216).

Fluctuations in the output signal (e.g., difference between the signal at the output pin 216 and the reference pin 218) can be prevented and/or suppressed (also referred to as isolation of output signal). In some implementations, fluctuations in the output signal with respect to the reference signal in the reference pin 218 (e.g., due to noise in the second reference signal transmitted by the lead 244) can be prevented/suppressed by a feedback circuit in the buffer. The feedback circuit can vary the output signal at the output pin 216 to track the fluctuations in the reference signal in the reference pin 218 (e.g., caused due to noise in the second reference signal transmitted by the lead 244). In some implementations, modifying the buffer circuit 206 to include the feedback circuit can allow for coupling between the buffer circuit 206 with an output circuit with considerable noise while preventing undesirable fluctuations in the output signal (e.g., difference between the signal at the output pin 216 and the reference pin 218). In some implementations, the feedback circuit can allow for common mode rejection (e.g., based on signals at the inverting input pin and the non-inverting input pin). Common mode rejection can allow for suppression/prevention of noise in the output signal based on noise at the reference signal (e.g., superposition of alternating current [AC] noise and direct current [DC] noise).

In some implementations, the noise in the second reference signal can be transmitted through two gain stages: the non-inverting stage electrically coupled to the non-inverting input pin 212 and an inverting stage coupled to the inverting input pin 214. The op-amp 210 can cancel the noise from the two stages resulting in reduced noise at the output pin 216. For example, the non-inverting input pin 212 can be electrically connected to the reference pin 218. This can be done, for example, by electrically connecting the non-inverting input pin 212 and the reference pin 218 via the impedance R4. In some implementations, fluctuations in the output signal can be suppressed by choosing impedances R1, R2 and R4 such that they have the same impedance value. Alternately, impedances R1, R2, R3 and R4 can be chosen such that fluctuations in the reference signal at the reference pin 218 do not have an effect (or have reduced effect) on the output of the buffer circuit 206 (e.g., by ensuring that output signal at the output pin 216 is changed to track the fluctuations [e.g., noise signal] in the reference signal at the reference pin 218).

Figure 3:
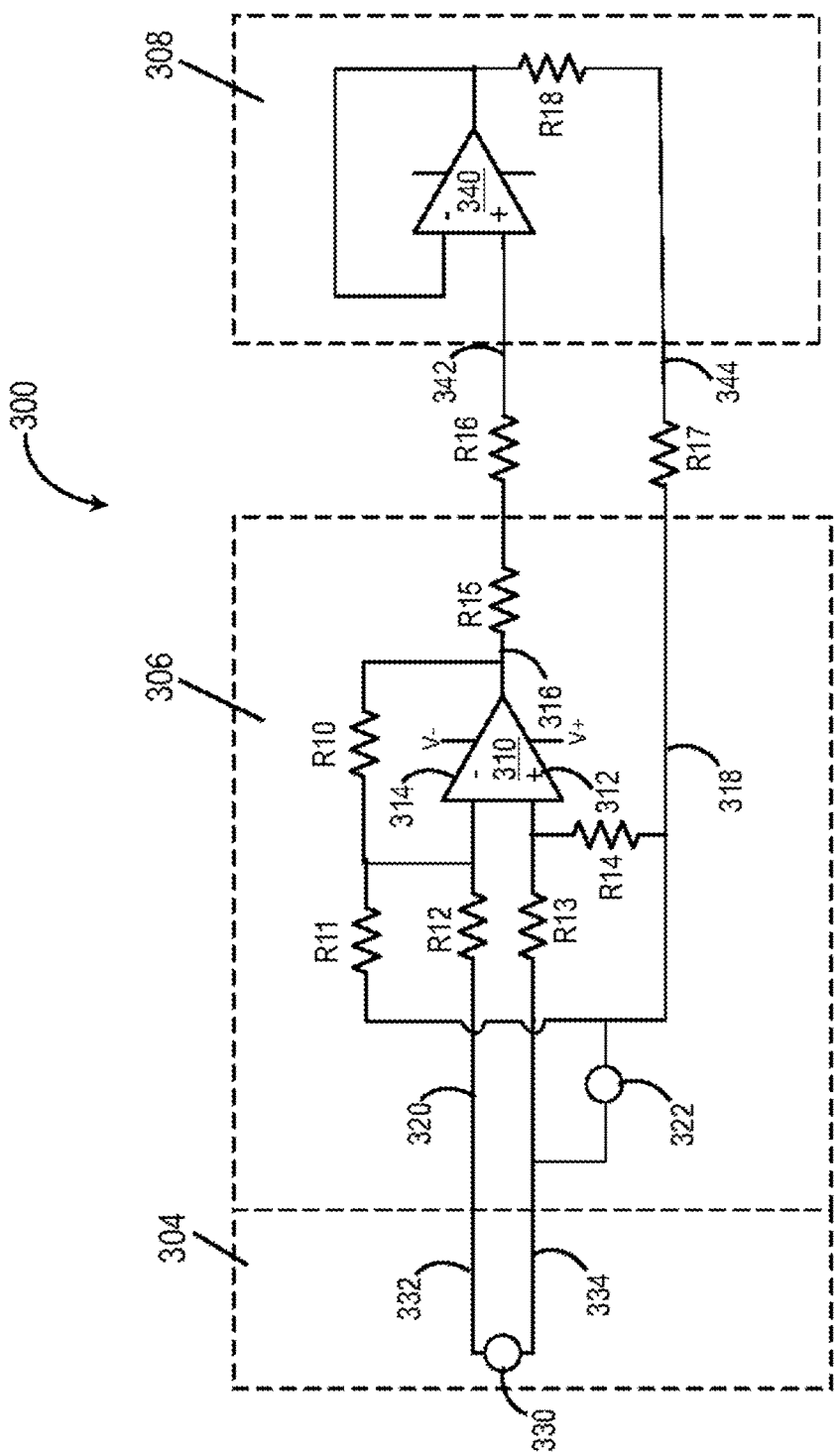
FIG. 3 illustrates and exemplary inverting detection system.

FIG. 3 illustrates an exemplary detection system 300 (e.g., an inverting detection system). The detection system 300 can include an input circuit 304, a buffer circuit 306, and an output circuit 308. The input circuit 304 can include, for example, a sensor. The sensor can include a voltage (or current) source 330 that can generate a voltage (or current) signal indicative of a measurement of a characteristic property of an industrial machine (e.g., oil and gas industrial machine). The input circuit 304 can include a first lead 332 (that can transmit a detection signal) and a second lead 334 (that can transmit a detection reference signal). The buffer circuit 306 can be electrically connected to the input circuit 304. For example, the buffer circuit 306 can be connected to the first lead 332 and the second lead 334 by electrical connections (e.g., by first and second electrical connections 112 and 114, respectively). The buffer circuit 306 can include an op-amp 310 which can include a non-inverting input pin 312, an inverting input pin 314 and an output pin 316.

In some implementations, the noise in the second reference signal can be transmitted through two gain stages: the non-inverting stage electrically coupled to the non-inverting input pin 312 and an inverting stage coupled to the inverting input pin 314. The op-amp 310 can cancel the noise from the two stages resulting in reduced noise at the output pin 316. For example, the inverting input pin 314 can be electrically connected to the output pin 316 via a first impedance R10, and to the reference pin 318 via a second impedance R11. The inverting input pin 314 can be electrically connected to the first lead 332 via a third impedance R12. The inverting input pin 314 can receive a detection signal (or a signal indicative of the detection signal) from the first lead 332. The non-inverting input 312 can be electrically connected to the second lead 334 via a fourth impedance R13, and to the reference pin 318 via a fifth impedance R14. The non-inverting input pin 312 can receive a signal indicative of the detection reference signal from the second lead 334.

The buffer circuit 306 can be electrically connected to an output circuit 308 (also referred to as "external circuit"). In some implementations, the output circuit 308 can be a part of an instrumentation system configured to analyze one or more characteristic properties of an industrial machine (e.g., industrial machine 102) detected by a sensor (e.g., a sensor included in the input circuit 304). In some implementations, the output circuit 308 can be a part of a display device configured to display characteristic property data detected by the input circuit 304. The output circuit 308 can include one or more of op-amps, resistors, inductors, capacitors and other circuit elements. The output circuit 308 can include a third lead 342 and a fourth lead 344. The output circuit 308 can be electrically connected to the buffer circuit 306. For example, third lead 342 and fourth lead 344 can be electrically connected to output pin 316 and reference pin 318, respectively, via a field wiring. The field wiring can include impedances R16 and R17 (e.g., that electrically couple the output pin 316 to the third lead 342, and reference pin 318 to the fourth lead 344, respectively).

The buffer circuit 306 can transform an impedance associated with the input circuit 304. The buffer circuit 306 can receive a signal from the input circuit 304 (e.g., signal indicative of a detection by a sensor in the input circuit 304 related to a difference between the detection signal and detection reference signal), and the output circuit can receive a signal from the buffer circuit 306 (e.g., which can be related to the signal received by the buffer circuit). For example, a difference between the output signal (e.g., at output pin 316) and reference signal (e.g., at reference pin 318) can be inversely proportional to the signal received by the buffer circuit 306 from the input circuit 304.

As described above, the reference pin 318 can be electrically coupled to the inverting input pin 314 via impedance R11 and to the fourth lead 344 of output circuit 308. In some implementations, the reference pin 318 and the fourth lead 344 are ground (e.g., are at a ground potential) and current may not flow between the fourth lead 344 and the reference lead 318. In some implementations, the reference pin 318 and the fourth lead 344 may not be at the same potential. This can result in flow of current between the fourth lead 344 and the reference lead 318. The aforementioned current flow can occur due to undesirable potential fluctuations in the output circuit 308 (e.g., in the instrumentation device that includes the output circuit 308) which can lead to a fluctuation in the reference signal at the reference pin 318. Additionally or alternately, undesirable potential fluctuation in the reference signal can occur due to thermal noise, noise in the surrounding environment, crosstalk, and the like. Fluctuations in the reference signal can lead to fluctuations in the output signal (e.g., output signal at the output lead 316).

Fluctuations in the output signal (e.g., difference between the signal at the output pin 316 and the reference pin 318) can be prevented/suppressed (also referred to as isolation of output signal). In some implementations, fluctuations in the output signal with respect to the reference signal in the reference pin 318 (e.g., due to noise in the second reference signal transmitted by the lead 344) can be prevented/suppressed by a feedback circuit in the buffer. The feedback circuit can vary the output signal at the output pin 316 to track the fluctuations in the reference signal in the reference pin 318 (e.g., caused due to noise in the second reference signal transmitted by the lead 344). In some implementations, modifying the buffer circuit 306 to include the feedback circuit can allow for coupling between the buffer circuit 306 with an output circuit with considerable noise while preventing undesirable fluctuations in the output signal (e.g., difference between the signal at the output pin 316 and the reference pin 318). In some implementations, the feedback circuit can allow for common mode rejection (e.g., based on signals at the inverting input pin and the non-inverting input pin). Common mode rejection can allow for suppression/prevention of noise in the output signal based on noise at the reference signal (e.g., superposition of AC noise and DC noise).

The non-inverting input pin 312 and the inverting input pin 314 can be electrically connected to the reference pin 318. This can be done, for example, by electrically connecting the non-inverting input pin 312 and the reference pin 318 via the impedance R14 and the inverting input pin 314 and the reference pin 318 via the impedance R11. In some implementations, fluctuations in the output signal can be suppressed by choosing impedances R10, R11, R12, R13 and R14 such that they have the same impedance value. Alternately, impedances R10, R11, R12, R13 and R14 can be chosen such that fluctuations in the reference signal at the reference pin 318 do not have an effect (or have reduced effect) on the output of the buffer circuit 306 (e.g., by ensuring that output signal at the output pin 316 is changed to track the fluctuations [e.g., noise signal] in the reference signal at the reference pin 318).

Other embodiments are within the scope and spirit of the disclosed subject matter. For example, the detection system (e.g., detection system 100, 200, 300 etc.) can be a part a monitoring system of oil and gas industrial machines in an oil field. The monitoring and detection system can be configured to detect characteristic properties of the various oil and gas industrial machines and respond accordingly. In some implementations, the detection system can include a sensing system located proximal to an oil and gas industrial machine and an instrumentation system that can be electrically coupled to the detection system. For example, the sensing system can include the sensor 104 (or input circuit 204, 304, etc.) and the buffer circuit 106, and the instrumentation system can include the output circuit 108 (or output circuits 208, 308, etc.). The sensing system and the instrumentation system can be electrically coupled by a field connector (e.g., including a third electrical connection 114 and a fourth electrical connection 116). The instrumentation system can include a reference signal relative to which the instrumentation system performs analysis of the output signal of the sensing system. undesirable noise signals. Coupling the instrumentation system to the sensing system can introduce a noise signal (e.g., due to circuit noise, transients, short circuit conditions, and the like in the instrumentation system) into the sensing system (e.g., via the reference signal of the instrumentation system). In some implementations, the buffer circuits comprising the feedback circuits described in this application can suppress undesirable effects resulting from coupling the sensing system with the instrumentation system. This can improve the operation of one or both of the sensing system and the instrumentation system.

Certain exemplary embodiments will now be described to provide an overall understanding of the principles of the structure, function, manufacture, and use of the systems, devices, and methods disclosed herein. One or more examples of these embodiments are illustrated in the accompanying drawings. Those skilled in the art will understand that the systems, devices, and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention. Further, in the present disclosure, like-named components of the embodiments generally have similar features, and thus within a particular embodiment each feature of each like-named component is not necessarily fully elaborated upon The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub-programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto-optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back-end component (e.g., a data server), a middleware component (e.g., an application server), or a front-end component (e.g., a client computer having a graphical user interface or a web interface through which a user can interact with an implementation of the subject matter described herein), or any combination of such back-end, middleware, and front-end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

What is claimed is:

1. A circuit comprising:
  a reference pin;
  an operational amplifier comprising:
    an output pin;
    an inverting input pin electrically coupled to the output pin via a first impedance and to the reference pin via a second impedance;
    a non-inverting input pin electrically coupled to the reference pin via a third impedance and configured to receive a detection signal,
    wherein the reference pin is configured to receive a detection reference signal associated with the detection signal.

2. The circuit of claim 1, wherein the output pin is configured to electrically couple to a first lead of an external circuit and the reference pin is configured to electrically couple to a second lead of the external circuit, wherein the operational amplifier is configured to isolate an output signal at the output pin from a reference signal at the reference pin.

3. The circuit of claim 2, wherein the operational amplifier is configured to isolate the output signal from the reference signal based on a feedback circuit comprising the first impedance, the second impedance and the third impedance, wherein the operational amplifier and the feedback circuit are configured to vary the output signal to follow the fluctuations in the reference signal.

4. The circuit of claim 3, wherein the first impedance, the second impedance and the third impedance have the same impedance value.

5. The circuit of claim 2, wherein a first difference between the output signal at the output pin and the reference signal at the reference pin is indicative of a second difference between the detection signal and the detection reference signal.

6. The circuit of claim 5, wherein the reference pin is configured to electrically couple to a third lead of an input circuit, wherein the third lead is configured to transmit the detection reference signal or a signal indicative of the detection reference signal.

7. The circuit of claim 2, wherein isolation of the output signal includes suppression of a noise signal indicative of voltage fluctuations in the external circuit, wherein the reference signal includes the noise signal.

8. The circuit of claim 2, wherein an instrumentation device includes the external circuit, and the instrumentation device configured to analyze the detection signal.

9. The circuit of claim 1, wherein the detection signal and the detection reference signal are indicative of a sensor measurement at an oil and gas industrial machine.

10. The circuit of claim 1, further comprising a filtering circuit wherein the reference pin or the non-inverting input pin is configured to receive the detection reference signal via the filtering circuit.

11. The circuit of claim 10, wherein the filtering circuit includes one of a high-pass filter, a low-pass filter, and a band-pass filter.

12. The circuit of claim 1, wherein the operational amplifier includes one or more bipolar junction transistor and/or one or more metal-oxide semiconductor field-effect transistors.

13. A circuit comprising:
a reference pin;
an operational amplifier comprising:
an output pin;
an inverting input pin electrically coupled to the output pin via a first impedance and to the reference pin via a second impedance, wherein the inverting input pin is configured to receive a detection signal;
a non-inverting input pin electrically coupled to the reference pin via a third impedance,
wherein the non-inverting pin is configured to receive a detection reference signal associated with the detection signal.

14. The circuit of claim 13, wherein the output pin is configured to electrically couple to a first lead of an external circuit and the reference pin is configured to electrically couple to a second lead of the external circuit, wherein the operational amplifier is configured to isolate an output signal at the output pin from a reference signal at the reference pin.

15. The circuit of claim 13, wherein the operational amplifier is configured to isolate the output signal from the reference signal based on a feedback circuit comprising the first impedance, the second impedance and the third impedance, wherein the operational amplifier and the feedback circuit are configured to vary the output signal to follow the fluctuations in the reference signal.

16. The circuit of claim 15, wherein the first impedance, the second impedance and the third impedance have a predetermined impedance value.

17. The circuit of claim 14, wherein a first difference between the output signal at the output pin and the reference signal at the reference pin is indicative of a second difference between the detection signal and the detection reference signal.

18. The circuit of claim 14, wherein isolation of the output signal includes suppression of a noise signal indicative of voltage fluctuations in the external circuit, wherein the reference signal includes the noise signal.

19. The circuit of claim 14, wherein an instrumentation device includes the external circuit, the instrumentation device configured to analyze the detection signal.

20. The circuit of claim 13, wherein the detection signal and the detection reference signal are indicative of a sensor measurement at an oil and gas industrial machine.

21. The circuit of claim 13, wherein the operational amplifier includes one or more bipolar junction transistor and/or one or more metal-oxide semiconductor field-effect transistors.

22. A detection system comprising:
a sensor configured to detect one or more properties of an oil and gas industrial machine and generate a detection signal and a detection reference signal indicative of the detection;
a buffer circuit comprising:
a reference pin configured to receive the detection reference signal;
an operational amplifier comprising:
an output pin,
an inverting input pin electrically coupled to the output pin via a first impedance and to the reference pin via a second impedance, and
a non-inverting input pin electrically coupled to the reference pin via a third impedance and configured to receive the detection signal; and
an instrumentation device comprising a first lead and a second lead, wherein the first lead is electrically coupled to the output pin and the second lead is electrically coupled to the reference pin.

23. The detection system of claim 22, wherein the operational amplifier is configured to isolate an output signal at the output pin from a reference signal at the reference pin.

24. The detection system of claim 22, wherein the instrumentation device is configured to analyze the detection signal.

* * * * *